United States Patent
He et al.

(10) Patent No.: US 7,800,119 B2
(45) Date of Patent: Sep. 21, 2010

(54) SEMICONDUCTOR LAMP

(75) Inventors: Xiyuan He, Guangdong (CN); Rui Ma, Guangzhou (CN); Wolfgang Georg Pabst, Deisenhofen (DE); Giovanni Scilla, Fontane de Villorba (IT)

(73) Assignee: OSRAM Gesellschaft mit beschrankänkter Haftung, München (DE)

( * ) Notice: Subject to any disclaimer, the term of this patent is extended or adjusted under 35 U.S.C. 154(b) by 253 days.

(21) Appl. No.: 11/975,984

(22) Filed: Oct. 22, 2007

(65) Prior Publication Data
US 2008/0157112 A1 Jul. 3, 2008

(30) Foreign Application Priority Data
Oct. 20, 2006 (EP) .................................. 06022067

(51) Int. Cl.
H01L 27/15 (2006.01)
(52) U.S. Cl. ................ 257/79; 257/88; 257/95; 257/98; 257/99; 257/100; 257/678; 257/680; 257/712; 257/731; 257/E25.019; 257/E25.028; 257/E33.066; 257/E33.067; 362/249.02; 362/365; 362/373; 362/800

(58) Field of Classification Search ....................... None
See application file for complete search history.

(56) References Cited

U.S. PATENT DOCUMENTS

| | | | | |
|---|---|---|---|---|
| 6,465,961 | B1 * | 10/2002 | Cao .............................. | 315/58 |
| 7,357,534 | B2 * | 4/2008 | Snyder ....................... | 362/294 |
| 7,402,961 | B2 * | 7/2008 | Bayat et al. .................. | 315/295 |
| 2004/0066142 | A1 | 4/2004 | Stimac et al. | |
| 2004/0264199 | A1 | 12/2004 | Shu et al. | |
| 2005/0024864 | A1 | 2/2005 | Galli | |
| 2005/0077616 | A1 * | 4/2005 | Ng et al. ...................... | 257/707 |
| 2005/0162864 | A1 | 7/2005 | Verdes et al. | |

* cited by examiner

Primary Examiner—Minh-Loan T Tran
Assistant Examiner—Fei Fei Yeung Lopez
(74) Attorney, Agent, or Firm—Cohen Pontani Lieberman & Pavane LLP

(57) ABSTRACT

A semiconductor lamp having a light-emitting semiconductor device, the semiconductor device comprising a carrier and at least one light-emitting semiconductor component on the carrier, and a heatsink. The heatsink has a first main face, the semiconductor device is located adjacent to the first main face, and the carrier faces the first main face. The semiconductor device is thermally coupled to the heatsink, and the heatsink has at least one feedthrough for electrical connection of the semiconductor device.

30 Claims, 6 Drawing Sheets

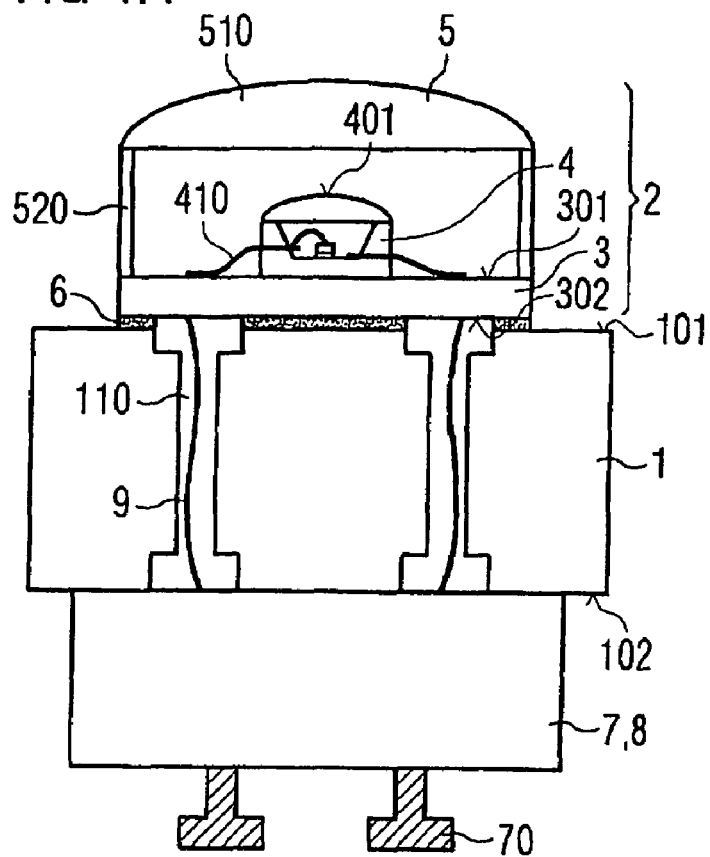
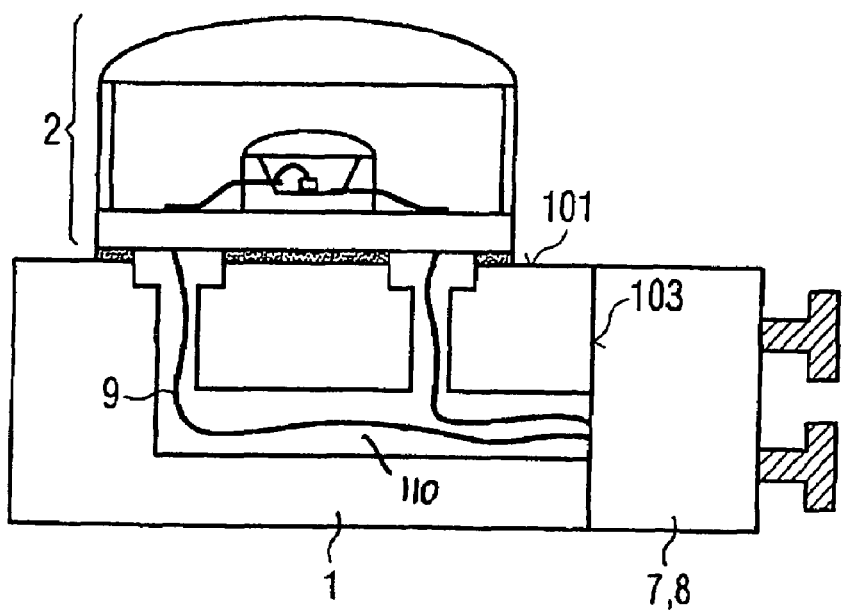

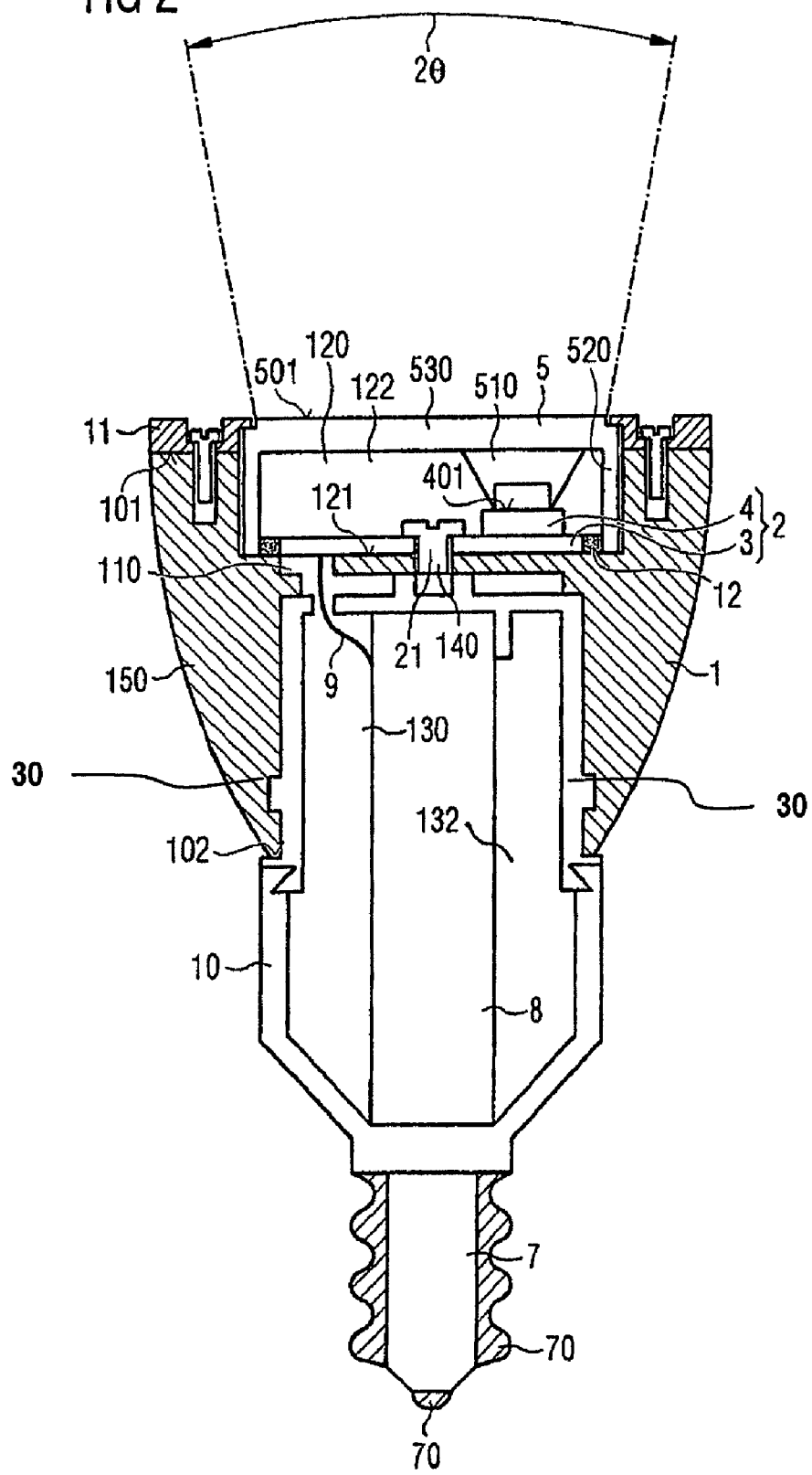

SEMICONDUCTOR LAMP

RELATED APPLICATION

This patent application claims the priority of European patent application 06022067.0 filed Oct. 20, 2006, the disclosure content of which is hereby incorporated by reference.

FIELD OF THE INVENTION

The invention relates to a semiconductor lamp having a light-emitting semiconductor device and a heat sink.

BACKGROUND OF THE INVENTION

The document U.S. Pat. No. 6,465,961 B1 discloses a semiconductor light source for illumination purposes.

SUMMARY OF THE INVENTION

It is an object of the present invention to provide a semiconductor light source with an improved heat sink and long lifetime.

This and other objects are attained in accordance with one aspect of the present invention directed to a semiconductor lamp that has a light-emitting semiconductor device, the light-emitting semiconductor device comprising a carrier and at least one light-emitting semiconductor component on the carrier, and a heat sink, wherein the heat sink has a first main face, the semiconductor device is located adjacent to the first main face, the carrier facing the first main face, the semiconductor device is thermally coupled to the heat sink, and the heat sink has at least one feedthrough for electrical connection of the semiconductor device.

In one embodiment, the lamp also comprises a control unit. The control unit is designed for supplying the light-emitting semiconductor device with electrical power. It is electrically connected to the light-emitting semiconductor device through the feedthrough and in operation supplies a current to the light-emitting device.

In a preferred embodiment, the first main face of the heat sink has a first recess and the light-emitting semiconductor device is located in the first recess. Preferably, the recess has a bottom region, especially preferably a flat bottom region, and the carrier is located adjacent to the bottom region and thermally coupled to the heat sink in the bottom region. The feedthrough starts, for example, from the first recess, preferably from the bottom region of the first recess.

In a preferred embodiment, the light-emitting semiconductor device does not project from the opening of the first recess. Radiation emitted from the semiconductor device is preferably coupled out through the opening of the first recess. In this context, the opening of the first recess is the area remote from the bottom region, in other words the area "cut out" from the first main face by the first recess.

A heatsink with feedthrough advantageously protects the semiconductor device and/or the electrical connection means, e.g. wires or the like, which are used for the electrical connection of the semiconductor device, from mechanical damage. At the same time, an improved heat dissipation is achieved. For example, it is not necessary that the housing of the semiconductor lamp surrounds the heat sink. Rather, the heat sink is preferably the housing or a part of the housing of the semiconductor lamp. Due to this improved thermal management, an extremely long lifetime of the light-emitting semiconductor component is achieved. For example, the semiconductor lamp, in particular the light-emitting semiconductor component, maintains or exceeds a predefined brightness, which is for example half of the initial brightness of the semiconductor component, for 50000 hours or more.

In a preferred embodiment, the semiconductor lamp comprises a base for use with standard sockets like sockets which are used for conventional light bulbs. With such a base, the semiconductor lamp is suitable for general illumination purposes. It provides an illumination source with a higher efficiency, a higher reliability and lifetime, an improved color impression—for example a green light source—and a smaller size than traditional lamps or LED light sources known in the art.

The base is, for example, located adjacent to the second main face, opposite of the first main face, of the heat sink. Preferably, it has an Edison-type threaded fitting, in particular an E14 or an E27 fitting, a bayonet connector or a pin connector.

In an especially preferred embodiment, the semiconductor lamp comprises an insulating part, the insulating part establishing a mechanically stable connection between the heat sink and the base. The insulating part preferably electrically insulates the heat sink from the base. To this end, the insulating part is preferably at least partially located between the heat sink and the base. For example, the insulating part has a first side, adjacent to the second main face of the heat sink, and a second side, remote from the heat sink, preferably opposite of the first side, and adjacent to the base.

Especially preferably, the heat sink has a second recess in a second main face and the insulating part extends into the second recess. Also preferably, the insulating part has a hollow shape. It can be formed, for example, of a plastic material.

In one embodiment, the insulating part is mechanically stable connected to the heat sink with a mechanical connection means, for example with a screw and/or a toothing. The base is preferably secured to the insulating part with an adhesive, for example an epoxy resin. Additionally or alternatively the base can be secured to the insulating part with a mechanical connection means.

With advantage, the insulating part electrically decouples the base from the heat sink. This allows safe operation of the semiconductor lamp and simplifies servicing of the light-emitting semiconductor device even when high voltages are applied to the base.

Preferably, the control unit is at least partially located in the second recess of the heat sink. More preferably, the control unit is at least partially surrounded by the insulating part. Especially preferably, the control unit is arranged in an interior of the insulating part, for example if the insulating part has a hollow shape, and does not project from the insulating part.

The heat sink advantageously also serves as a heat sink for the control unit, so that a small size of the semiconductor lamp can be achieved and cost effective production is possible.

Preferably, the control unit is electrically connected to the base. In one embodiment, it is designed for operation with standard AC input of 110-120 V or 220-240V. The control unit preferably comprises an isolation transformer.

In an especially preferred embodiment, the semiconductor lamp comprises an optical element. The optical element has a main light transmission face through which radiation emitted from the light-emitting semiconductor device is coupled out. The optical element is preferably arranged adjacent to the first main face of the heat sink. Especially preferably, the main light transmission face at least partially covers the opening of the first recess. For example, the optical element comprises a window. The window preferably comprises the main light transmission surface, and especially preferably covers the first recess at least partially.

In a preferred embodiment, the optical element comprises a beam forming element arranged downstream of the light-emitting semiconductor component. The beam forming element is usually located between the semiconductor component and the main light transmission face. It preferably comprises a lens and/or a mirror. For example a lens is especially preferably integrated in the window.

If the semiconductor lamp comprises a plurality of light-emitting semiconductor components, an individual beam forming element is preferably assigned to each semiconductor component.

The optical element can, for example, narrow or widen the beam emitted from the light-emitting semiconductor component. For example, the beam emitted from the main light transmission face of the optical element in operation of the lamp can have an opening angle 2θ between 15° and 30°, in particular between 20° and 24°, where the boundaries are included. In another embodiment, the opening angle 2θ has a value between 60° and 120°, where the boundaries are included.

In at least one embodiment, the optical element comprises a positioning element. The positioning element can be, for example a side wall, a post, a clearance or the like. The positioning element is designed for positioning the optical element in a predefined position with respect to the light-emitting semiconductor device and/or the heat sink, for example by arrangement in or on a corresponding guidance structure of the heat sink. The guidance structure can, for example, be a clearance or a protrusion like a finger.

In one embodiment, the optical element extends into the first recess of the first main face. For example, at least a portion of the window, the beam forming element and/or the positioning element is located in the first recess, in other words between the opening and the bottom region of the first recess. Preferably, the positioning element extends to the bottom region of the first recess. Especially preferably the positioning element is a side wall having basically the same shape and/or lateral dimensions as a side region between the opening and the bottom part of the first recess. Advantageously, the positioning element provides a predefined lateral and vertical position of the optical element with respect to the light-emitting semiconductor device and/or the heatsink.

The window, the beam forming element and/or the positioning element are preferably formed as one piece, especially preferably from a homogenous material. In at least one embodiment, the whole optical element is formed as one piece, for example by injection molding.

In another embodiment, the semiconductor lamp comprises a sealing ring adjacent to the light-emitting semiconductor device. The sealing ring preferably surrounds the carrier in its main plain of extent. Preferably, the sealing ring, the carrier and the optical element completely surround the light-emitting semiconductor component and form an encapsulation for the light-emitting semiconductor component. Advantageously, penetration of moisture to the semiconductor component is thereby avoided.

In an additionally preferred embodiment, a cover ring is provided, securing the optical element to the heat sink. The cover ring is located adjacent to the first main face of the heat sink and to the main light transmission face of the optical element. The cover ring is connected to the heat sink, in particular to the first main face of the heat sink, in a mechanically stable way, for example with at least one screw and/or rivet and/or with an adhesive.

Preferably, the cover ring surrounds, in particular completely surrounds, the opening of the first recess. Preferably, the shape of the cover ring corresponds to the shape of the opening of the first recess. The cover ring and/or the first recess can have, for example, a circular, elliptical or polygonal, in particular triangular, rectangular quadratic or hexagonal, shape when viewed in top view on the first main face.

In a preferred embodiment, the heat sink has at least one side face, located between and preferably connecting the first main face and the second main face. The side face preferably has a basically circular or polygonal, for example rectangular or quadratic, shape in top view on the first main face. In a more preferred embodiment, the cross-sectional area of the side face in top view on the first main face is larger in a top region of the side face adjacent to the first main face than in a bottom region of the side face adjacent to the second main face. Preferably, the side face is narrowing in the course from the first main face towards the second main face. In one embodiment, the side face has a middle region between the top and bottom regions which is a waist, in particular the smallest cross-sectional area of the middle region is the smallest cross-sectional area of the side face in top view on the first main face.

In an especially preferred embodiment, the side face has a plurality of protrusions. Preferably, a protrusion has a lamellar form, in other words, the protrusion is formed as a fin. The fin preferably starts adjacent to the first main face of the heat sink and runs towards the second main face of the heat sink. Especially preferably, the lamellar protrusion extends from the first main face to the second main face. The protrusions advantageously enlarge the surface of the heat sink and therefore improve heat dissipation.

In a preferred embodiment, the cover ring securing the optical element to the heat sink extends laterally beyond the side face of the heat sink. In other words, the cover ring extends at least partially over at least one protrusion in top view on the first main face. The cover ring, in particular a portion of the cover ring extending laterally beyond the side face, preferably comprises a plurality of holes or notches which extend over the whole thickness of the cover ring. The holes or notches promote air circulation through the cover ring and heat dissipation by convection, even if the semiconductor lamp is tightly fit in a holder. If the protrusions have the form of fins, at least one hole or notch is preferably arranged between two fins in top view on the first main face.

The heat sink is preferably formed of a metal, especially preferably of aluminium. The carrier is preferably a printed circuit board, which especially preferably has a metal core. A metal core printed circuit board provides for a very efficient conduction of heat from the light-emitting semiconductor component to the heat sink.

The light-emitting semiconductor component is preferably mounted on a connection face of the carrier, which is a main area of the carrier, remote from the heat sink.

The term "light-emitting semiconductor component" in the present context encompasses any kind of light-emitting diode or laser diode, including organic light-emitting diodes. The light-emitting semiconductor component comprises a stack of layers of organic and/or anorganic material, for example a semiconductor chip. The stack of layers includes an active electroluminescent layer suitable for emitting electromagnetic radiation.

Preferably, a high-power light-emitting semiconductor component is used. A high-power light-emitting semiconductor component preferably has an electrical power consumption of 0.5 W or more, especially preferably between 1 and 3 W, where the boundaries are included.

The light-emitting semiconductor component preferably has electrical connectors and a thermal connector, which especially preferably is different from the electrical connectors. The stack of layers is preferably located on the thermal connector. The thermal connector is thermally coupled to the carrier, for example by soldering.

Also preferably, the light-emitting semiconductor component comprises a reflector and/or a lens. For example, the reflector and/or lens direct a portion of the light emitted from the active layer towards a light output face of the semiconductor component and/or enlarge or reduce the solid angle into which electromagnetic radiation is emitted through a light output surface of the light-emitting semiconductor component. Advantageously, thereby the shape of the beam emitted from the semiconductor component is optimized for coupling in to the optical element.

The light-emitting semiconductor device preferably comprises a plurality of light-emitting semiconductor components. For example it comprises three light-emitting semiconductor components, which are preferably mounted on a carrier with a basically circular shape. More preferably, the three semiconductor components are located at the same distance from the center of the carrier and especially preferably in an angle of 120° with respect to each other.

The semiconductor lamp preferably has an electrical input power of 3 W or more, especially preferably between 5 and 7 W, where the boundaries are included.

The illuminance of the beam emitted from the semiconductor lamp in operation preferably has a value of 600 lux or more at a distance of 1 m from the first main face of the heat sink.

BRIEF DESCRIPTION OF THE DRAWINGS

FIG. 1A shows a cross-sectional view of a first embodiment of the semiconductor lamp, FIG. 1B shows a cross-sectional view of a variant of the embodiment illustrated in FIG. 1A, FIG. 2 shows a cross-sectional view of a second embodiment of the semiconductor lamp.

DETAILED DESCRIPTION OF THE DRAWINGS

Figure 3:
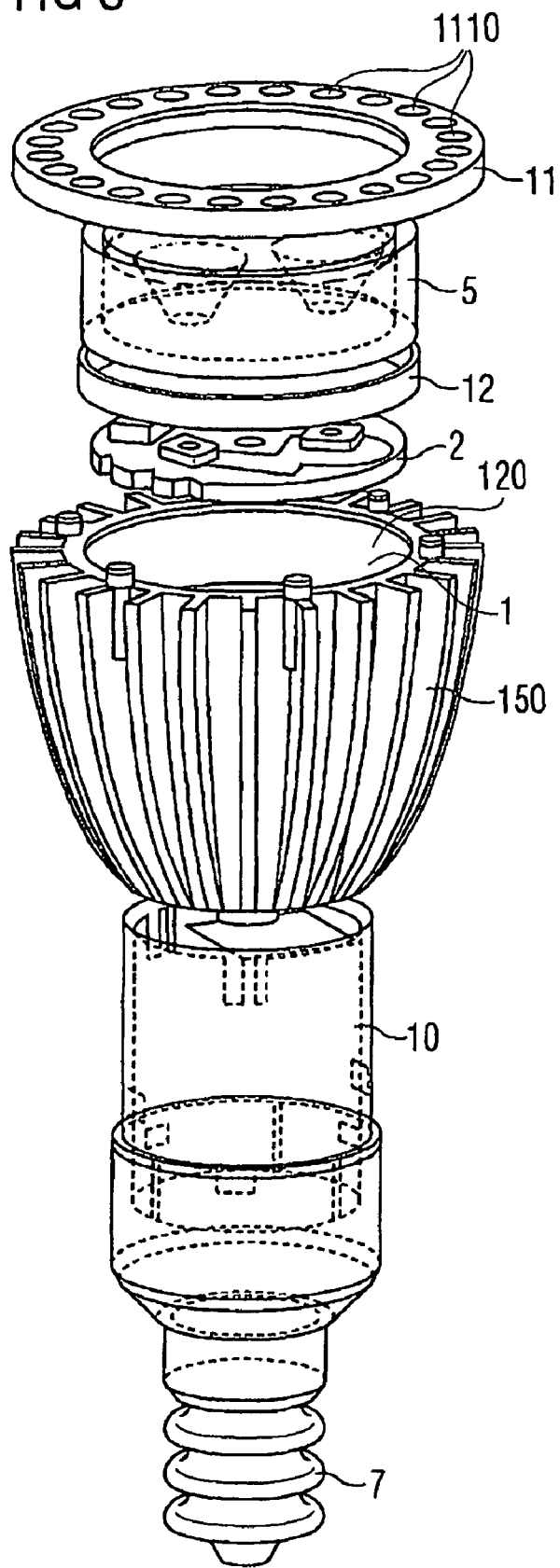
FIG. 3 shows an exploded perspective view of the semiconductor lamp according to the second embodiment.

The figures are basically schematic and not to be considered true to scale, nor are the individual elements essentially depicted in their actual dimensional relationships to one another. Throughout the exemplary embodiments and figures, identical or equivalent components are in each case provided with identical reference symbols.

The semiconductor lamp according to the first exemplary embodiment, illustrated in FIG. 1A, comprises a heat sink 1 consisting of copper. On the first main face 101 of the heat sink 1, a light-emitting semiconductor device 2 is mounted. The light-emitting semiconductor device 2 comprises a carrier 3 and a light-emitting semiconductor component 4 which is mounted on a connection face 301 of the carrier 3, remote from the heat sink 1. The light-emitting semiconductor device 4 is a light-emitting diode (LED), which is mechanically, electrically, and thermally connected to the carrier 3 by its electrical connectors 410, which are, for example, soldered to the connection face 301 of the carrier. In the present embodiment, the LED 4 is centered on the carrier 3.

The semiconductor lamp further comprises an optical element 5. The optical element 5 has a beam forming element 510, which is a lens in this case, and at least one positioning element 520. The positioning element 520 places the beam forming element 510 in a predefined position with respect to a light output surface 401 of the light-emitting semiconductor component 4. Light emitted from the light-emitting semiconductor component 4 through the light output surface 401 in operation therefore is coupled out from the light-emitting semiconductor device 2 via the beam forming element 510.

The light-emitting semiconductor device 2 is arranged on the heat sink 1 with a mounting face 302, which is a main area of the carrier 3 opposite of the connection face 301 of the carrier 3, facing the first main face 101 of the heat sink 1.

A mechanically stable connection and thermal coupling of the light-emitting semiconductor device 2 to the heat sink 1 is provided, for example, by a thermally conducting adhesive 6 between the carrier 3 and the heat sink 1. For example, an adhesive heat conducting film can be used.

Adjacent to a second main face 102 of the heat sink 1, opposite of the first main face 101, a base 7, comprising a control unit 8, is arranged. Electrical power is supplied to the control unit 8 by a pin connector 70 from an external power source.

The control unit 8 is designed for driving the light-emitting semiconductor device 2. Therefore, it is electrically connected via wires 9 to the latter. The wires 9 are fed through feedthroughs 110 of the heat sink 1. In the present embodiment, the feedthroughs 110 extend from the first main face 101 of the heat sink 1 to the second main face 102 of the heat sink 1.

In a variant of this exemplary embodiment, illustrated in FIG. 1B, a feedthrough 110 connects the first main face 101 and a side face 103 of the heat sink 1.

The base 7, which is located adjacent to the side face 103 of the heat sink 1, is connected via wires 9 to the light-emitting semiconductor device 2, located adjacent to the first main face 101 of the heat sink 1. The wires 9 enter the feedthrough 110 through an opening in the side face 103. In the path from the side face 103 to the first main face 101 of the heat sink, the feedthrough 110, for example, divides up into a plurality of branches. Therefore, if, for example, the light-emitting semiconductor device 2, in particular the carrier 3, has a plurality of electrical connection points where electrical connection means like the wires 9 are connected to the semiconductor device 2 or enter the semiconductor device 2, an individual feedthrough may end next to each electrical connection point.

The semiconductor lamp according to the second exemplary embodiment, illustrated in FIG. 2, comprises a heat sink 1 consisting of aluminum, preferably cast aluminum. The first main face 101 of the heat sink 1 has a first recess 120. The light-emitting semiconductor device 2 is located in the first recess 120. It is mounted on a flat bottom region 121 of the first recess 120 and the carrier 3 of the light-emitting semiconductor device 2 is thermally connected to the heat sink 1 in this bottom region 121. The light-emitting semiconductor device 2 does not project from an opening 122 of the first recess 120, which is remote from the bottom region 121.

The light-emitting semiconductor device 2 is mechanically stably connected to the bottom region 121 of the heat sink 1 via a mechanical connection means. The mechanical connection means can, for example, comprise a screw or a rivet 21 and a corresponding clearance 140 in the heat sink 1. The light-emitting semiconductor device 2 can be fixed with one or with a plurality of mechanical connection means. Here, it is mounted with a single center screw and clearance.

The heat sink 1 also has a second recess 130 in its second main face 102. An insulating part 10 is located adjacent to the second main face 102 of the heat sink 1 and extending into the second recess 130 of the second main face 102. Adjacent to the insulating part 10, remote from the heat sink, a base 7 is located. In the present exemplary embodiment, the base 7 comprises an Edison type threaded fitting 70 as used for conventional light bulbs. The insulating part 10 provides a mechanically stable connection between the heat sink 1 and the base 7 and electrically insulates the base 7 from the heat sink 1. Preferably, the base 7 is connected to the insulating part 10 with an adhesive and/or by pressing the base 7 onto the insulating part 10.

The insulating part is formed of a plastic material. It comprises two pieces. The first piece 10a is located in the second recess 130 of the heat sink 1 and preferably projects from the opening 132 of the second recess 130 of the second main face 102 of the heat sink. It is, for example, mechanically stably connected to the heat sink with at least one fixation means. For example, the first piece can have at least one protrusion 30 fitting into a recess in a face of the second recess 130, in particular in a recess in a sidewall of the second recess 130.

In addition or as an alternative, the mechanical connection means designed for the fixation of the light-emitting semiconductor device 2 to the heat sink 1 can also be used to fixate the first piece to the heat sink 1. The mechanical connection means comprises, for example, a clearance extending from the bottom region 121 of the first recess 120 of the heat sink 1 to an upper region of the second recess 130, adjacent to the bottom region 121 of the first recess 120. A side of the first piece of the insulating part 10 which is facing the first main face 101 of the heat sink preferably has a recess, extending the clearance 140 in direction to the second main face 102. In this case, preferably a screw extending through a hole in the carrier, through the clearance 140 of the heat sink and into the recess of the first piece is used to provide a mechanically stable connection of the semiconductor device 2, as well as of the insulating part 10 to the heat sink 1.

Especially preferably, the insulating part 10 also comprises a second piece 10b. The second piece 10b is preferably arranged completely outside the heat sink 1. It is especially preferably connected in a mechanically stable way to the first piece, for example with a toothing 32. In other words, respective neighboring regions of the first and second piece in one embodiment each have snap-in structures which intertwine into each other when the first and second pieces are assembled.

The insulating part 10 preferably has a hollow shape. In other words, the insulating part 10 surrounds an interior. Preferably, a control unit 8 is arranged in the interior.

The control unit 8 is advantageously fixed in a predetermined place by holding elements provided in the insulating part. The production process of the semiconductor lamp thereby is advantageously simplified as the control unit 8 is automatically kept in place by the holding elements by assembling the first and second piece of the insulating part 10, without the need to fix the control unit 8 to the insulating part 10 in an additional process step.

The control unit 8 is electrically connected to the light-emitting semiconductor device 2 with wires 9, which are fed through at least one feedthrough 110 of the heat sink 1 and preferably enter the insulating part 10 through at least one opening in the insulating part 10.

Figure 4A:
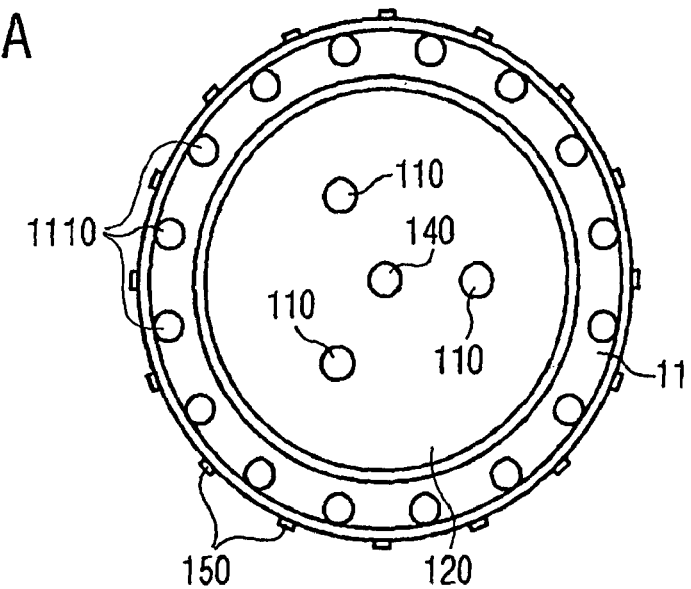
FIG. 4A shows a top view on the heat sink of the semiconductor lamp according to the second embodiment.

In the present exemplary embodiment, the feedthrough 110 extends from the bottom region 121 of the first recess 120 to the upper region of the second recess 130. As can be seen from the top and bottom view in FIGS. 4A and 4B, respectively, a plurality of feedthroughs 110 is provided in this embodiment. For example, an individual feedthrough can be provided for each light-emitting semiconductor component 3 of the light-emitting semiconductor device 2. In the present exemplary embodiment, three feedthroughs 110 are arranged at the same distance from the center of the first recess 120 and in an angle of 120° with respect to each other, when viewed in top view on the first main face 101.

The control unit 8 is also electrically connected to the Edison type threaded fitting 70 via wires or the like (not shown). The control unit 8 according to the present exemplary embodiment is designed for operation with a standard AC input of 220-240 V and/or 100-120 V, supplied from an external power source to the lamp through the base 7.

The control unit 8 comprises an isolation transformer electrically connected in such a way that the heat sink 1 and the light-emitting semiconductor device 2 are electrically insulated, in other words galvanically decoupled, from the high voltage present at the lamp base 7.

The control unit 8 operates the light-emitting semiconductor device 2 preferably at a low voltage, especially preferably at safety extra low voltage. The output voltage of the control unit 8, supplied to the light-emitting semiconductor device 2 in operation, preferably has a maximum value of 60 V or less, especially preferably of 25 V or less. Advantageously, the heat sink 1 does not have to be grounded in this case, although it can be touched by the user in operation of the semiconductor lamp.

The semiconductor lamp according to the present embodiment also comprises an optical element 5. The optical element 5 comprises, for example, a window 530 with a main light transmission face 501, through which light emitted from the light-emitting semiconductor component 4 through its light output face 401 is coupled out from the semiconductor lamp.

The optical element 5 also comprises a beam forming element 510 downstream of the light-emitting semiconductor component 4. The beam forming element comprises, for example, a reflector. Preferably, the beam forming element has the shape of a cone, a pyramid, a truncated cone, or a truncated pyramid, with sidewalls forming the reflector. Especially preferably, the beam forming element 510 also comprises a lens. The lens and the reflector may be formed as one piece.

The optical element 5 also comprises a positioning element 520. In the present embodiment, the optical element has a round or elliptical shape when viewed in top view on the main light transmission face 501 and the positioning element 520 is an annular sidewall. It is, however, also possible that the positioning element 520 comprises a plurality of sidewalls, for example when the optical element has the shape of a polygon when viewed in top view on the main light transmission face 501. The positioning element 520 can also be formed as posts or the like.

Preferably, at least a portion of the surface of the sidewall is structured or roughened. For example the inner side of the side wall, facing the light-emitting semiconductor component and remote from the heatsink, is structured or roughened.

The optical element basically completely covers the opening 122 of the first recess 120 of the first main face 101 of the heat sink 1 and extends into the first recess 120. Alternatively, the optical element 5 can also extend laterally beyond the edges of the first recess 120.

The window 530, the beam forming element 510 and/or the positioning element 520 are preferably formed integrally, for example by injection molding.

The beam coupled out from the semiconductor lamp through the main light transmission face 501 of the optical element 5 in operation is formed by the optical element 5 to have an opening angle 2θ of 15° to 30°, in particular of 20° to 24°, where the boundaries are included.

The optical element 5 is fixed to the heat sink 1 with a cover ring 11. The cover ring 11 is connected to the heat sink 1 with at least one screw or rivet 21 and/or with an adhesive. It extends, for example, laterally over a marginal region of the optical element 5, the marginal region neighboring, for example, the side wall and the opening 122 of the first recess 120, and thereby keeps it in place.

As can be seen, for example, from the exploded perspective view of FIG. 3, the cover ring has a plurality of holes 1110. The holes 1110 extend over the whole thickness of the cover ring (also confirm FIGS. 4A and 4B). The holes 1110 are at least partially located in a portion of the cover ring extending laterally beyond the side face 103 of the heat sink when viewed, for example, in bottom view on the second main face 102 of the heat sink 1, as illustrated in FIG. 4B.

Figure 4B:
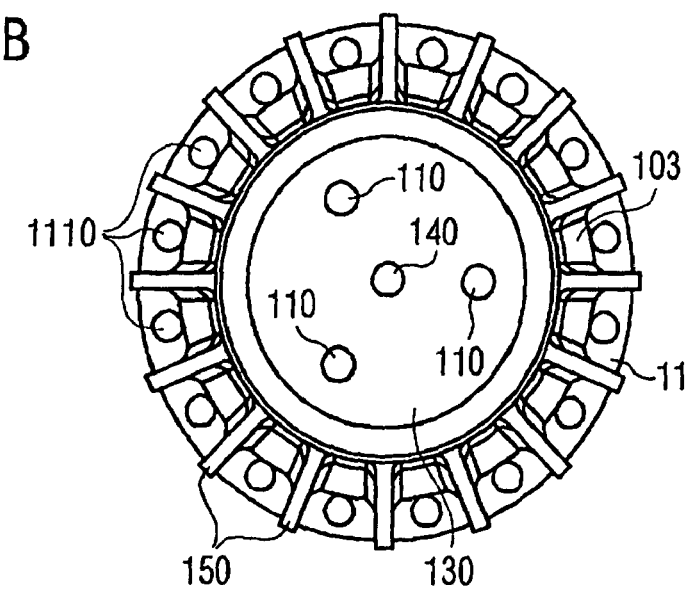
FIG. 4B shows a bottom view of the heat sink of the semiconductor lamp according to the second embodiment.

FIG. 4B also shows that the heat sink 1 comprises a plurality of protrusions 150, projecting from the side face 103 of the heat sink 1. An outer portion of the protrusions 150 may, for example, extend laterally beyond the cover ring 11.

The protrusions have, for example, the form of fins. They preferably extend from the first main face 101 to the second main face 102 of the heat sink.

Especially preferably, at least one hole 1110, in particular, a single hole 1110, is arranged between two adjacent fins 150 when viewed in top view on the first main face 101 of the heat sink 1.

A semiconductor lamp according to the present embodiment also comprises a sealing ring 12 which is preferably located adjacent to the first main face 101 of the heat sink 1. Especially preferably, the sealing ring 12 is located in the first recess 120, in particular in the bottom region 121 of the first recess.

The sealing ring may, for example, surround the carrier 3 in its main plain of extent. Preferably, the sealing ring completely surrounds the carrier 3.

The sealing ring 12, for example in combination with the carrier 3, the optical element 5, and/or the heat sink 1, encapsulates the light-emitting semiconductor component 4. The encapsulation of the light-emitting semiconductor component 4 advantageously prevents its contact with moisture and thereby reduces the risk of accelerated degradation of the semiconductor component 4.

The beam emitted from the semiconductor lamp in operation through the main light transmission face 501 of the optical element 5 preferably has an opening angle 2θ of 20 to 24°, where the boundaries are included.

The semiconductor lamp has a housing which comprises the heat sink 1. The housing preferably also comprises the insulating part 10, the socket 7, the optical element 5, and/or the cover ring 11.

The heat sink advantageously has an improved heat dissipation when being part of the housing, compared, for example, to a heat sink located in the interior of an additional housing. The external area of the heat sink 1, through which heat is dissipated, is maximized.

The optimized heat dissipation makes the semiconductor lamp especially suitable for use with a high-power light-emitting semiconductor component 4 such as a high-power LEDs. According to the present exemplary embodiment, the light-emitting semiconductor device 2 comprises three high-power semiconductor components 4. These are preferably mounted on the carrier 3 at the same distance from its center and especially preferably in an angle of 120° with respect to each other, when viewed in top view on the connection face 301 of the carrier 3.

Figure 5:
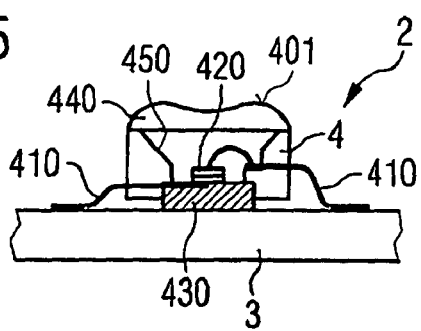
FIG. 5 shows a cross-sectional view of a cut-out of the light-emitting semiconductor device of the semiconductor lamp according to the second embodiment.

A cut-out from the light-emitting semiconductor device 2 with a preferred type of a high-power LED 4 is illustrated in FIG. 5. The high-power LED 4 comprises a stack of layers 420 of a semiconductor material. The stack of layers 420 comprises an active layer which, in operation, emits electromagnetic radiation.

The layer stack 420 is electrically connected to at least two electrical connectors 410. A portion of the electrical connectors 410 projects from the housing of the light-emitting semiconductor device and are preferably formed in such a way that the semiconductor component is surface mountable.

The stack of layers 420 is, for example, arranged on a thermal connector 430, which is preferably different from the electrical connectors 410. The thermal connector 430 is preferably thermally connected to the carrier 3 of the light-emitting semiconductor device 2, for example by soldering.

In addition, the light-emitting semiconductor component 4 comprises a lens 440 through which at least a portion of the light emitted by the active layer is coupled out and a reflector 450, in particular a reflective side wall or a plurality of reflective side walls surrounding the stack of layers 420. The reflective side wall 450 is preferably inclined against the main plane of extent of the thermal connector 430 and directs a portion of the radiation emitted by the active layer towards the light output surface 401 of the semiconductor component 4.

The carrier 3 is preferably a printed circuit board and especially preferably has a metal core, so that heat is effectively conducted to the heat sink.

The semiconductor lamp according to the present exemplary embodiment has a round or elliptical shape when viewed in top view on the first main face of the heat sink. However, a polygonal shape, in particular a triangular, rectangular, quadratic, or hexagonal shape, is also possible.

Figure 6A:
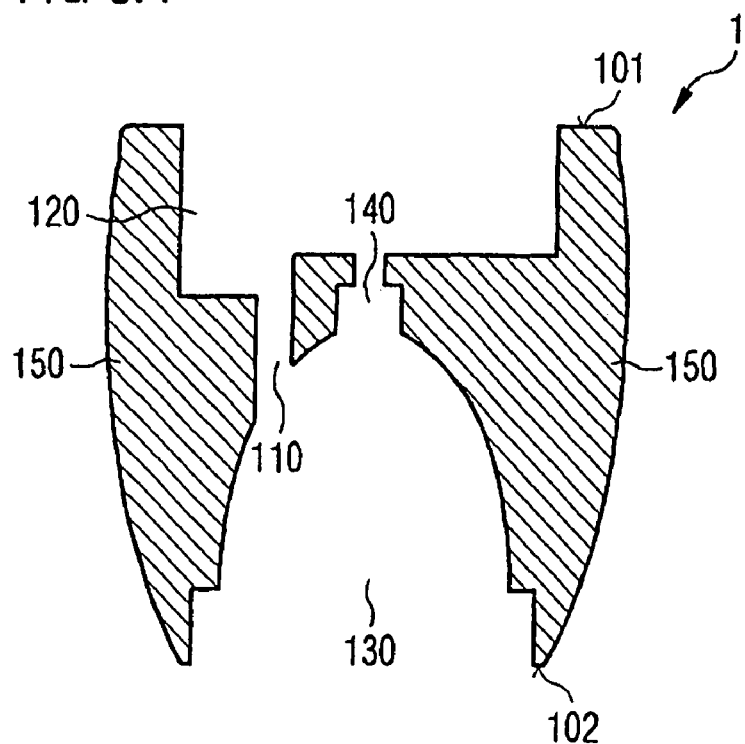
FIG. 6A shows a cross-sectional view of a heat sink according to a third embodiment, which runs through fins 150.
Figure 6B:
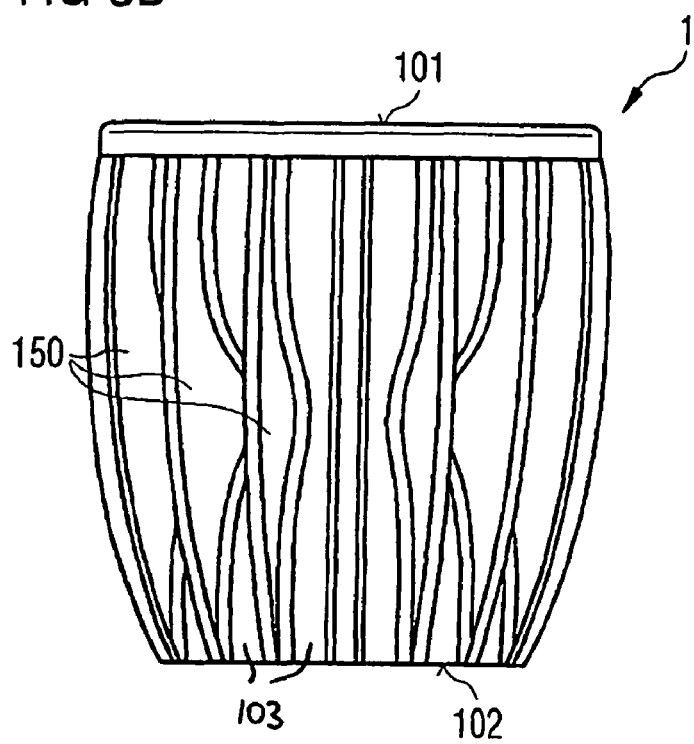
FIG. 6B shows a side view of the heat sink of FIG. 6A.

The second recess 130 of the heat sink 1 basically has the shape of a circular or elliptical cylinder. However, it may also have the shape of a cone, a truncated cone, a pyramid, a truncated pyramid, a cylinder with a polygonal cross-section like a cuboid or a cube or it may have a dome form. A heat sink 1 with a second recess 130, which has an upper portion formed as a dome or a bell and a lower part which formed as a cylinder, is illustrated in FIG. 6A.

Preferably, the shape of the side face 103 corresponds to the shape of the first and second recess. In other words, a first region of the side face surrounding the first recess has a form similar to the form of the first recess and/or a second region of the side face surrounding the second recess has a form similar to the second recess.

For example, if a contour of the first (second) recess in top view on the first (second) main face has a circular shape, the contour of the first (second) region of the side face may also have a circular shape in top view on the first (second) main face.

In addition, the cross section of the first (second) recess changes in the course from the first (second) to the second (first) main face. In particular, the cross section decreases. The first recess of the exemplary embodiment shown in FIG. 6A, for example, has a cylindrical shape, i.e. the cross section has a practically constant value and decreases step-like at the bottom of the first recess. The second recess of the exemplary embodiment shown in FIG. 6A, for example, has a form like a dome or a bell with the cross section gradually decreasing in the course from the second to the first main face.

The cross section of the side face of the heat sink is preferably formed in a similar way. The first region of the side face surrounding the first recess has, for example, a relatively constant cross section. The cross section of the second region of the side face which surrounds the second recess gradually decreases in the course from the second to the first main face. In a middle region between the first and second regions, the cross section of the side wall is smaller than adjacent to the first and second main faces. To put it in another way, the middle region forms a waist.

Especially preferably, the side face 103 has a plurality of protrusions, in particular in the form of fins 150, running preferably from the first main face to the second main face. The protrusions, for example, are broader in the middle region to compensate for the waist.

Figure 6C:
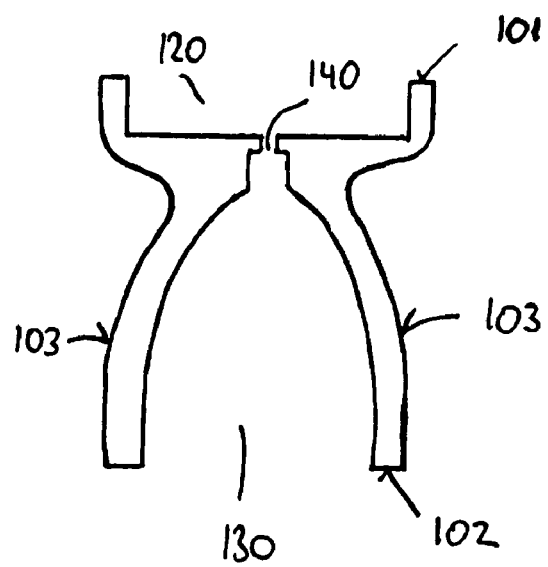
FIG. 6C shows a cross-sectional view of the heat sink which does not run through fins 150.

Especially preferably, the contour of the cross-sectional area of the heat sink including the protrusions does not have a local minimum when running from the first main face 101 to the second main face 102 as shown in FIG. 6A, in contrast to the cross-sectional area of the heat sink alone, as shown in FIG. 6C. In this way, the surface area of the heat sink through which heat is dissipated is further increased.

Figure 6D:
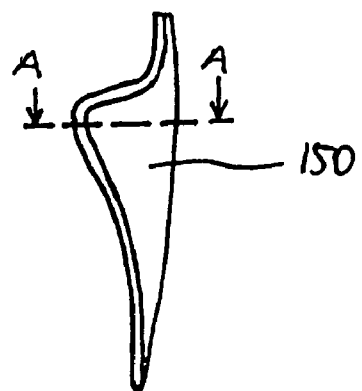
FIG. 6D shows a side view of fin 150.
Figure 6E:
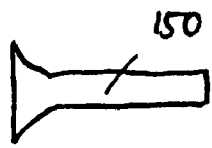
FIG. 6E shows a cross-section view of fin 150 along line A-A in FIG. 6D.

FIG. 6D shows a side view of a fin 150, and FIG. 6E shows a cross-section of fin 150 along line A-A in FIG. 6D.

The scope of protection of the invention is not restricted by the description of the invention on the basis of the exemplary embodiments. Rather, the invention encompasses any new feature and also any combination of features, which in particular comprises any combination of features in the patent claims, even if this combination is not explicitly specified in the patent claims.

We claim:

1. A semiconductor lamp comprising:
a light-emitting semiconductor device comprising a carrier and at least one light-emitting semiconductor component on the carrier,
a heatsink having first and second main faces, which are opposite from each other and are formed with respective first and second recesses,
an optical element with a main light transmission face, through which radiation emitted from the light-emitting semiconductor device is coupled out, wherein the optical element extends into the first recess of the first main face, and
a control unit,
wherein the semiconductor device is located adjacent to the first main face, the carrier facing the first main face,
wherein the light-emitting semiconductor device is thermally coupled to the heatsink,
wherein the heatsink has at least one feedthrough formed in the heatsink for electrical connection of the light-emitting semiconductor device,
wherein the control unit is electrically connected to the light-emitting semiconductor device through the feedthrough and in operation supplies a current to the light-emitting semiconductor device,
wherein the light-emitting semiconductor device is arranged in the first recess, and
wherein the carrier is mounted to a bottom region of the first recess and thermally coupled to the heatsink in the bottom region.

2. The lamp as claimed in claim 1, wherein the light-emitting semiconductor device does not project from an opening of the first recess and radiates through the opening of the first recess.

3. The lamp as claimed in claim 2, wherein the feedthrough extends from the bottom region of the first recess to an upper region of the second recess.

4. The lamp as claimed in claim 1, further comprising a base for connecting with standard sockets of light bulbs, wherein the base is located adjacent to the second main face of the heatsink.

5. The lamp as claimed in claim 4, further comprising an insulating part, the insulating part establishing a mechanically stable connection between the heatsink and the base and electrically insulating the heatsink from the base.

6. The lamp as claimed in claim 1, wherein the control unit is at least partially located in the second recess such that the heatsink also serves as heatsink for the control unit.

7. The lamp as claimed in claim 6, further comprising:
a base for connecting to standard sockets of light bulbs, the base being located adjacent to the second main face of the heatsink, and
an insulating part establishing a mechanically stable connection between the heatsink and the base and electrically insulating the heatsink from the base,
wherein the control unit is at least partially surrounded by the insulating part.

8. The lamp as claimed in claim 7, wherein the control unit is arranged in an interior of the insulating part and does not project from the insulating part.

9. The lamp as claimed in claim 8, wherein the control unit comprises an isolation transformer.

10. The lamp as claimed in claim 1, wherein the optical element comprises a beam forming element arranged downstream of the light-emitting semiconductor component, the beam forming element comprising at least one of a lens and a mirror.

11. The lamp as claimed in claim 10, comprising a plurality of light-emitting semiconductor components, wherein an individual beam forming element is assigned to each of the plurality of semiconductor components.

12. The lamp as claimed in claim 1, further comprising a sealing ring, wherein the carrier, the optical element and the sealing ring completely surround and encapsulate the light-emitting semiconductor component.

13. The lamp as claimed in claim 12, wherein the sealing ring surrounds the carrier in a main plane of extent of the carrier.

14. The lamp as claimed in claim 1, wherein the optical element is secured to the heatsink with a cover ring adjacent to the first main face of the heatsink and to the main light transmission face of the optical element, and wherein the cover ring surrounds an opening of the first recess.

15. The lamp as claimed in claim 14, wherein the heatsink has at least one side face located between the first main face and the second main face and having a plurality of protrusions, and wherein a portion of the cover ring extends laterally beyond the side face.

16. The lamp as claimed in claim 15, wherein the portion of the cover ring which extends laterally beyond the side face comprises a plurality of holes or notches extending through a thickness of the cover ring.

17. The lamp as claimed in claim 16, wherein the plurality of protrusions have the form of fins and wherein a hole or notch is arranged between two fins as seen in a top view on the first main face.

18. The lamp as claimed in claim 1, wherein the heatsink has at least one side face located between the first main face and the second main face and having a plurality of protrusions.

19. The lamp as claimed in claim 1, wherein the carrier is a printed circuit board having a metal core.

20. The lamp as claimed in claim 1, wherein the light-emitting semiconductor component has electrical connectors and at least one thermal connector, which is different from the electrical connectors and is thermally coupled to the carrier.

21. The lamp as claimed in claim 1, having an electrical input power of at least 3 W.

22. The lamp as claimed in claim 1, wherein the heatsink is formed of a metal.

23. A semiconductor lamp comprising:
a light-emitting semiconductor device comprising a carrier and at least one light-emitting semiconductor component on the carrier;
a heatsink having first and second main faces, the second main face having a recess;
a control unit at least partially located in the recess and comprising an isolation transformer;
a base for connecting with standard sockets used for light bulbs, the base being located adjacent to the second main face of the heatsink and opposite the first main face; and
a hollow insulating part extending into the recess, the hollow insulating part establishing a mechanically stable connection between the heatsink and the base and electrically insulating the heatsink from the base;
wherein the light-emitting semiconductor device is located adjacent to the first main face and thermally coupled to the heatsink, the carrier facing the first main face,
wherein the heatsink has at least one feedthrough for electrical connection of the light-emitting semiconductor device,
wherein the control unit is electrically connected to the light-emitting semiconductor device through the feedthrough for supplying a current to the light-emitting semiconductor device during operation of the semiconductor lamp, and
wherein the control unit is arranged in an interior of the hollow insulating part and does not project from the hollow insulating part.

24. A semiconductor lamp comprising a light-emitting semiconductor device having a carrier and at least one light-emitting semiconductor component on the carrier, an optical element with a main light transmission face through which radiation emitted from the light-emitting semiconductor device is coupled out, a heatsink, and a control unit, wherein
the heatsink has a first main face, the light-emitting semiconductor device being located adjacent to the first main face and thermally coupled to the heatsink, the carrier facing the first main face;
the heatsink has at least one feedthrough for electrical connection of the light-emitting semiconductor device, the control unit being electrically connected to the light-emitting semiconductor device through the feedthrough and in operation supplying a current to the light-emitting device;
the first main face has a first recess, the light-emitting semiconductor device being located in the first recess, the optical element extending into the first recess;
the optical element is secured to the heatsink with a cover ring adjacent to the first main face of the heatsink and to the main light transmission face of the optical element, the cover ring surrounding an opening of the first recess; and
the heatsink has at least one side face located between the first main face and the second main face and having a plurality of protrusions, a portion of the cover ring extending laterally beyond the side face.

25. A semiconductor lamp comprising:
a light-emitting semiconductor device comprising a carrier and at least one light-emitting semiconductor component on the carrier,
a heatsink having first and second main faces, which are opposite from each other and are formed with respective first and second recesses,
a base for connecting with standard sockets of light bulbs, wherein the base is located adjacent to the second main face of the heatsink;
an insulating part, the insulating part establishing a mechanically stable connection between the heatsink and the base and electrically insulating the heatsink from the base; and
a control unit,
wherein the semiconductor device is located adjacent to the first main face, the carrier facing the first main face,
wherein the light-emitting semiconductor device is thermally coupled to the heatsink,
wherein the heatsink has at least one feedthrough formed in the heatsink for electrical connection of the light-emitting semiconductor device,
wherein the control unit is electrically connected to the light-emitting semiconductor device through the feedthrough and in operation supplies a current to the light-emitting semiconductor device,
wherein the light-emitting semiconductor device is arranged in the first recess, and
wherein the carrier is mounted to a bottom region of the first recess and thermally coupled to the heatsink in the bottom region.

26. The lamp as claimed in claim 25, wherein the insulating part has a hollow shape.

27. The lamp as claimed in claim 25, wherein the insulating part is formed of a plastic material.

28. The lamp as claimed in claim 25, wherein the insulating part extends into the second recess.

29. A semiconductor lamp comprising:
a light-emitting semiconductor device comprising a carrier and at least one light-emitting semiconductor component on the carrier,
a heatsink having first and second main faces, which are opposite from each other and are formed with respective first and second recesses, and
a control unit,
wherein the semiconductor device is located adjacent to the first main face, the carrier facing the first main face,
wherein the light-emitting semiconductor device is thermally coupled to the heatsink,
wherein the heatsink has at least one side face located between the first main face and the second main face, a plurality of protrusions, and at least one feedthrough formed in the heatsink for electrical connection of the light-emitting semiconductor device, wherein the control unit is electrically connected to the light-emitting semiconductor device through the feedthrough and in operation supplies a current to the light-emitting semiconductor device, wherein the light-emitting semiconductor device is arranged in the first recess, and wherein the carrier is mounted to a bottom region of the first recess and thermally coupled to the heatsink in the bottom region.

30. A semiconductor lamp comprising:

a light-emitting semiconductor device comprising a carrier and at least one light-emitting semiconductor component on the carrier, a heatsink having first and second main faces, which are opposite from each other and are formed with respective first and second recesses, and a control unit, wherein the semiconductor device is located adjacent to the first main face, the carrier facing the first main face, wherein the light-emitting semiconductor device is thermally coupled to the heatsink, wherein the carrier is a printed circuit board having a metal core, wherein the heatsink has at least one feedthrough formed in the heatsink for electrical connection of the light-emitting semiconductor device, wherein the control unit is electrically connected to the light-emitting semiconductor device through the feedthrough and in operation supplies a current to the light-emitting semiconductor device, wherein the light-emitting semiconductor device is arranged in the first recess, and wherein the carrier is mounted to a bottom region of the first recess and thermally coupled to the heatsink in the bottom region.

* * * * *

UNITED STATES PATENT AND TRADEMARK OFFICE
CERTIFICATE OF CORRECTION

PATENT NO. : 7,800,119 B2
APPLICATION NO. : 11/975984
DATED : September 21, 2010
INVENTOR(S) : Xiyuan He et al.

Page 1 of 1

It is certified that error appears in the above-identified patent and that said Letters Patent is hereby corrected as shown below:

On the Title Page, Item (73) should read

(73) OSRAM Gesellschaft mit ~~beschrankänter~~ beschränkter Haftung, München (DE)

Signed and Sealed this
Eighth Day of October, 2013

Teresa Stanek Rea
*Deputy Director of the United States Patent and Trademark Office*